United States Patent [19]

Cho et al.

[11] Patent Number: 5,262,361

[45] Date of Patent: Nov. 16, 1993

[54] VIA FILLING BY SINGLE CRYSTAL ALUMINUM

[75] Inventors: Chih-Chen Cho, Richardson; Bruce E. Gnade, Rowlett, both of Tex.

[73] Assignee: Texas Instruments Incorporated, Dallas, Tex.

[21] Appl. No.: 817,871

[22] Filed: Jan. 7, 1992

[51] Int. Cl.$^5$ .................... H01L 21/285; H01L 21/283
[52] U.S. Cl. ..................... 437/245; 437/105; 437/203; 437/194; 156/DIG. 61; 156/DIG. 103; 156/610
[58] Field of Search ............... 437/105, 245, 203, 194; 148/DIG. 48, DIG. 58, DIG. 169; 156/610, 612, DIG. 61, DIG. 103

[56] References Cited

U.S. PATENT DOCUMENTS

| | | | |
|---|---|---|---|
| 3,929,527 | 12/1975 | Chang et al. | 437/176 |
| 4,325,776 | 4/1982 | Menzel | 156/610 |
| 4,554,030 | 11/1985 | Haisma et al. | 148/175 |

FOREIGN PATENT DOCUMENTS 3-30474  2/1991  Japan .

OTHER PUBLICATIONS

Yamada, "Recent Progress in Depositing Epitaxial Metal Films by an Ionized Cluster Beam", *Nuclear Instruments & Methods in Physics Research B*, vol. B55, No. 1/4, Apr. 11, 1991, pp. 544–549.
Niva et al., "Epitaxial Growth of AL On SI(001) by Sputtering", *Applied Physics Letters*, vol. 59, No. 5, Jul. 29, 1991, pp. 543–545.
Thangaraj et al., "Epitaxial Growth of (001)AL On (100)SI by Vapor Deposition", *Applied Physics Letters*, vol. 61, No. 1, Jul. 6, 1992, pp. 37–39.
Yahashi, et al., *Applied Surface Science* (1985) vol. 43 No. 1-4 Dec. 1989 Abstract.
Yamada, et al., *Conference on Solid State Devices and Materials* (1985) Abstract.
C.-C. Cho, et al., "Low Temperature Epitaxial Growth of Al on Si(111) and CaF$_2$(111) Using Molecular Beam Epitaxy", *Mat. Res. Soc. Proc.*, pp. 87–92, vol. 221, 1991.
C.-H. Choi, et al., "Epitaxial Growth of Al(111) Si(111) Films Using Partially Ionized Beam Deposition", *Applied Physics Letter*, pp. 1992–1994, 51 (24), Dec. 14, 1987.
Shoso Shingubara, et al., "Electromigration in a Single Crystalline Submicron Width Aluminum Interconnection", *Applied Physics Letter*, pp. 42–44, (1), Jan. 7, 1991.
F. K. LeGoues, et al. "Atomic Structure of the Epitaxial Al-Si Interface", *Philosophical Magazine A*, pp. 833–841, vol. 53, No. 6, 1986.
F. K. LeGoues, et al., "Atomic Structure of the Epitaxial Al/Si Interface", *Mat. Res. Soc. Symp. Proc.*, pp. 395–400, vol. 37, 1985.
A. S. Ignat'ev, et al. "Auger Electron Spectroscopy of an Aluminum-Silicon System", *Sov. Tech. Phys. Lett.*, pp. 174–175, 8(4), Apr. 1982.
Isao Yamada, "Metallization by Ionized Cluster Beam Deposition", *IEEE Transactions on Electron Devices*, pp. 1018–1025, vol. ED-34, No. 5, May 1987.

*Primary Examiner*—Mary Wilczewski
*Attorney, Agent, or Firm*—Chris D. Pylant; Richard A. Stoltz; James C. Kesterson

[57] ABSTRACT

A method for forming single crystal aluminum films 14 on the surface of a substrate 12 (e.g. silicon {111} or Si{111}) is presented, comprising the steps of cleaning the substrate, then maintaining the substrate at certain temperature and pressure conditions while electrically neutral aluminum is deposited by a vacuum evaporation technique. Novel structures wherein single crystal aluminum contacts 20 fill via holes 18 in insulating layers 16 are presented. Novel structures wherein a single crystal aluminum film 14 exists on a substrate comprised of more than one crystalline material 12, 22 are presented.

4 Claims, 2 Drawing Sheets

5,262,361

VIA FILLING BY SINGLE CRYSTAL ALUMINUM

FIELD OF THE INVENTION

This invention relates to the fabrication of integrated circuits, specifically the formation of metal structures used as electrical contacts and interconnections.

BACKGROUND OF THE INVENTION

Polycrystalline aluminum has been widely used in integrated circuits because of its high conductivity, patternability, good adherence and bondability, low cost, easy availability and ease of deposition. However, polycrystalline aluminum has poor electromigration resistance and intermixes with silicon at temperatures above 400° C. To solve these problems, small amounts of copper and silicon are added into the polycrystalline aluminum. The copper, however, makes the metal alloy difficult to plasma etch. The silicon can precipitate and thus increase the electrical resistance of the metal path.

SUMMARY OF THE INVENTION

While single crystal aluminum is known to exhibit high electromigration resistance and good thermal stability, it has not been used in the microelectronics industry (perhaps it has been thought that growing single crystal aluminum would be totally impractical). A process which allows deposition of single crystal aluminum would be an advantage to the microelectronics industry.

A method for forming single crystal aluminum on the surface of a substrate is presented, comprising the steps of cleaning the substrate, then maintaining the substrate at certain temperature and pressure conditions while electrically neutral aluminum is deposited by a vacuum evaporation technique. Novel structures wherein single crystal aluminum fills via holes in insulating layers are presented. Novel structures wherein a single crystal aluminum film exists on a substrate comprised of more than one crystalline material are presented.

DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
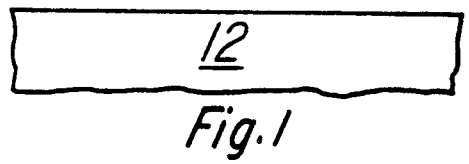
FIG. 1 represents a cross-section view of a substrate 12 which has been cleaned.
Figure 2:
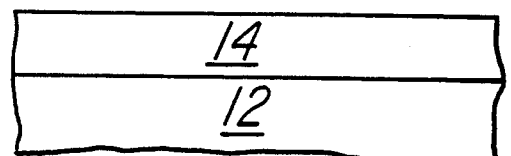
FIG. 2 represents a cross-section view of a substrate 12 after a single crystal metal film 14 has been deposited.
Figure 3:
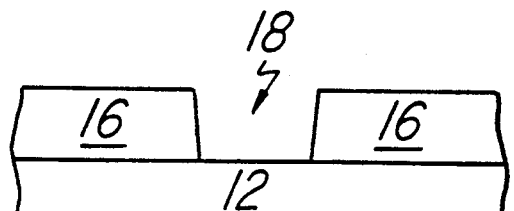
FIG. 3 represents a cross-section view of a via hole 18 in an amorphous insulator 16 on the surface of a substrate 12.
Figure 4:
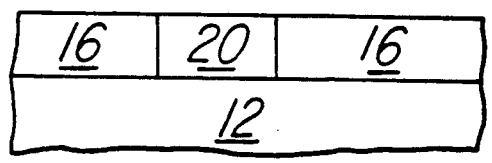
FIG. 4 represents a cross-section view of a via hole which has been filled with single crystal metal 20.

Single crystal aluminum was grown on 4 inch diameter substrates in an ultrahigh-vacuum system composed of a molecular beam epitaxy (MBE) chamber and a metallization chamber. Wafers can be transferred between these chambers through an ultrahigh-vacuum transfer system, which is annexed with two sample introduction load locks. Base pressure of the MBE chamber and the metallization chamber were below $1\times10^{-10}$ millibar and $1\times10^{-9}$ millibar, respectively. The process pressure during aluminum growth on Si{111} was $1\times10^{-7}$ millibar. The process pressure during aluminum growth on all other substrates was $2\times10^{-9}$ millibar.

Before aluminum deposition, clean silicon surfaces 12 were obtained by either (1) annealing Si{111} wafers in the MBE chamber at 950° C. for 10 minutes, plus another 10 minutes with a silicon flux equivalent to a deposition rate of 0.01 monolayer/second, or (2) rinsing Si{111} wafers in diluted 49% HF/methanol (1:5) followed by a methanol rinse immediately before they were introduced into the load lock. Reflection high-energy diffraction (RHEED) and Auger spectroscopy were used to characterize the cleaning process. Ge{111} and Ge{100} surfaces were prepared by depositing germanium on Si{111} and Si{100} respectively, which were cleaned by aforementioned high temperature annealing process. Via hole structures 18 were made from Si{100} substrates 12 and SiO$_2$ sidewalls 16.

After cleaning, the silicon wafers were transferred to the metallization chamber and aluminum films 14 of thickness from 0.5 to 2.4 micrometers were deposited from an electron beam evaporator at various substrate temperatures. The electron beam heating method produces a flux of electrically neutral aluminum atoms which travel across the metallization chamber and adhere to the substrate. Aluminum films were also deposited on Ge{111}, Ge{100}, and on wafers with 1 micrometer diameter via holes as described above.

X-ray diffraction techniques (so called rocking curves) were used to determine the crystalline quality of the resulting aluminum films. In contrast to the films deposited on Si{111} by a conventional evaporation technique which are polycrystalline aluminum (e.g. mixed Al{111} and Al{100}), we produced only single crystal Al{111} on Si{111}. While an ion-assisted process has been used in the past to obtain aluminum epitaxial growth at room temperature, we demonstrated that room temperature epitaxial growth can be achieved without ionized particles whether the silicon substrate is cleaned by high-temperature annealing or wet etching. Neutral beam deposition is a more simple process and results in more uniform films.

Figure 5:
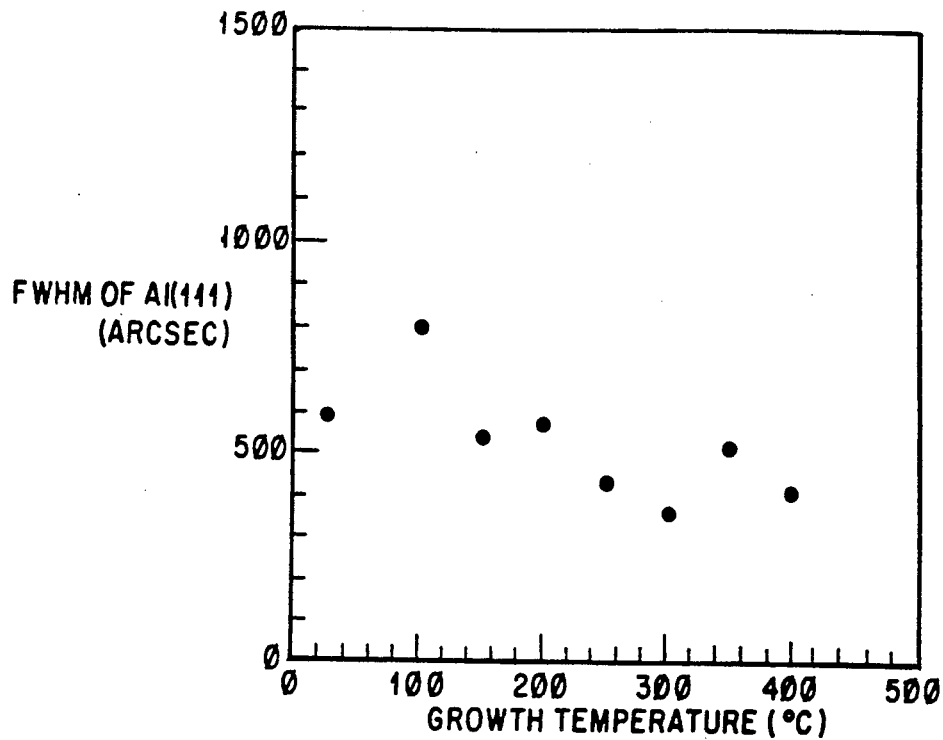
FIG. 5 is a graph which indicates aluminum crystal quality versus growth temperature.

When the thickness of these aluminum films is identical, the crystalline quality can be compared by the full-width-half-maximum (FWHM) of the aluminum rocking curve. FIG. 5 shows the FWHMs of Al{111} peaks measured from 0.5 micrometer thick films grown on high-temperature-annealed Si{111} at various temperatures. The FWHM is smallest when aluminum is grown at 300° C. This is very close to the theoretical temperature (310° C.) at which the lattice parameter ratio of silicon to aluminum is 4:3. The crystalline quality improves as the film thickness increases.

Figure 6:
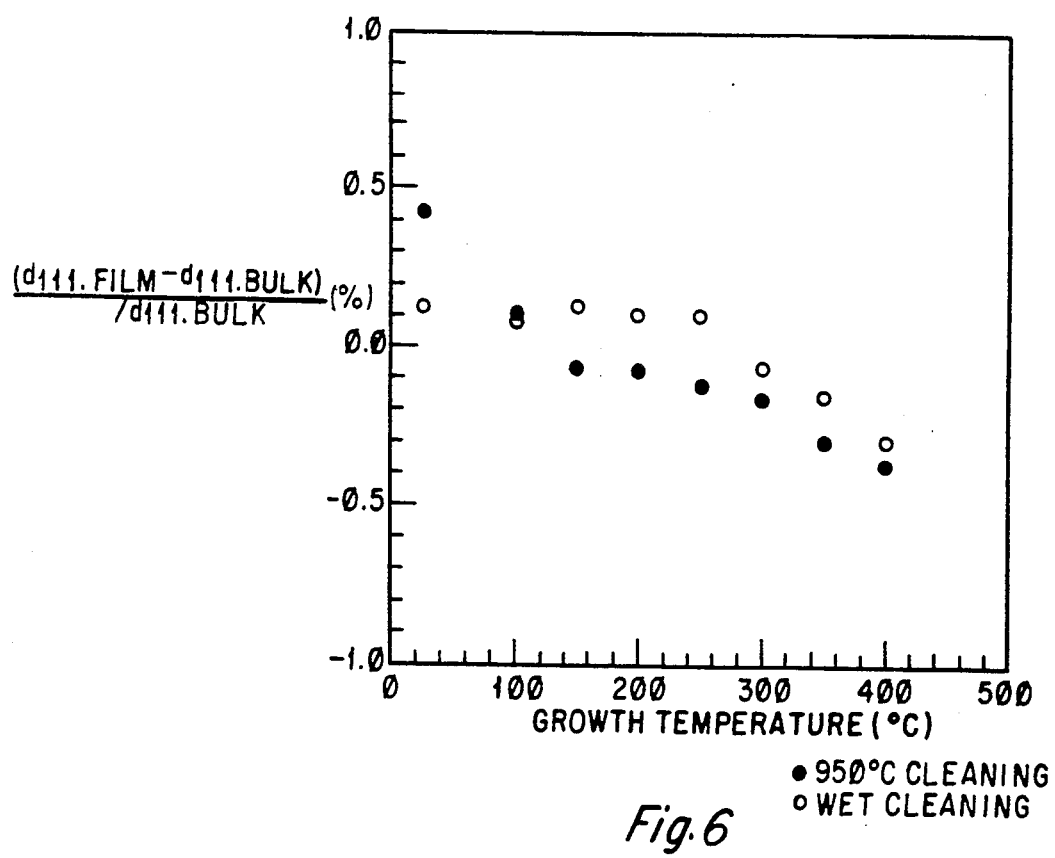
FIG. 6 is a graph which indicates aluminum lattice distortion versus growth temperature.

Using the Si{111} peak as the reference, we can obtain the precise Bragg angle of Al{111}. The plane distance along the {111} direction can thus be derived from these angles. FIG. 6 shows the atomic distortion of Al{111} on Si{111} for substrates cleaned by both high-temperature annealing and wet etching. The plane distances of Al{111} are larger than the bulk aluminum lattice constant when the films are grown at room temperature, indicating that compressive stresses exist in these films. The Al{111} plane distance decreases as the growth temperature increases, and the stress becomes tensile at higher growth temperature. The lattice distortion is within ±0.1% for films grown at 50° C. to 250° C., and increases more sharply as the growth temperature rises above 300° C. Wafer warpage measured by the Lang topography method shows that the stress is around $5 \times 10^8$ to $9 \times 10^8$ dyne/cm$^2$.

Table 1 shows the orientations of the aluminum films grown on several silicon and germanium substrates. The appropriate substrate temperatures to grow single crystal aluminum films are also given. As is indicated, 300° C. is the temperature at which the highest quality Al{111} films are produced on a Si{111} substrate. The pressure for all depositions was $2 \times 10^{-9}$ millibar.

TABLE 1

Substrate Temperatures for Aluminum Deposition

| SUBSTRATE | FILM | TEMPERATURE (°C.) |
|---|---|---|
| Si{111} | Al{111} | 25–400 (300 best) |
| Si{100} | Al{110} | 300–400 |
| Ge{111} | Al{111} | 25–200 |
| Ge{100} | Al{110} | 25 |
| Ge{100} | Al{100} | 100–200 |

Single crystal aluminum growth was also verified within the via holes 18. Images obtained through cross section transmission electron microscopy show that single crystal aluminum contacts 20 can be grown at 300° C. in a via hole 18 of Si{100} substrate 12 and SiO$_2$ sidewalls 16, where the diameter of the via and the SiO$_2$ thickness are both 1 micrometer. Smooth single crystal aluminum of no dislocation defect or grain boundary was obtained. The aluminum adjacent to the Si{111} surface and the SiO$_2$ sidewalls shows little stress. The aluminum in the via does not stick to the SiO$_2$ sidewall and exhibits a flat surface. By controlling the amount of aluminum deposited, one can make the aluminum in the via level with the SiO$_2$ surface which will make a subsequent planarization process much easier.

With respect to the electrical properties of these structures, we found the single crystal Al/n-Si contact formed a Schottky barrier and single crystal Al/p-Si and Al/Ge formed ohmic contact at room temperature. In many situations small contact resistance may be required. A layer of epitaxial germanium can be deposited at the bottom of vias by selective chemical vapor deposition or molecular beam epitaxy before single crystal aluminum is deposited on the germanium layer. This will allow single crystal aluminum deposition in vias on Si{100} substrates at very low temperatures (25°–200° C.) with the resulting structure exhibiting small contact resistance (i.e. no Schottky barrier will be formed).

Figure 7:
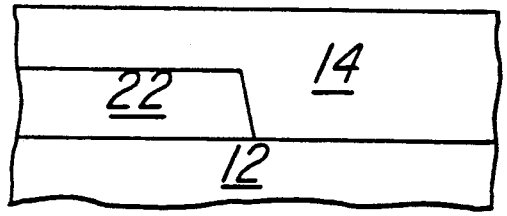
FIG. 7 represents an example of a single crystal metal film 14 deposited onto a compound surface made up of a substrate 12 and a single crystal insulator 22.

We have also demonstrated single crystal epitaxial growth of aluminum on calcium fluoride (CaF$_2$). Additionally, this process will generally form single crystal metal films on surfaces which are made up of more than one type of single crystal material, an example of which is depicted in FIG. 7 which shows part of a single crystal metal film 14 (e.g. aluminum) on a single crystal substrate 12 (e.g. silicon) and another part on single crystal insulator 22 (e.g. calcium fluoride). The structure illustrated in FIG. 7 is all single crystal even though it is composed of three different materials. Single crystal metal films formed on these compound substrates will impart the advantages of single crystal metals to three dimensional integrated devices.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming single crystal aluminum, said method comprising the steps of:
   (a) maintaining a silicon {100} substrate at a temperature between about 300° C. and 400° C. or a germanium {111} substrate at a temperature between about 25° C. and 200° C. or a germanium {100} substrate at a temperature of about 2520 C. or a germanium {100} substrate at a temperature between about 100° C. and 200° C. or a CaF$_2$ substrate at a temperature condition;
   (b) maintaining said substrate at a pressure condition; and
   (c) depositing electrically neutral aluminum onto a surface of said substrate by a vacuum evaporation technique.

2. The method according to claim 1 wherein said pressure condition is about $2 \times 10^{-9}$ millibar or below.

3. The method according to claim 2 wherein said substrate is silicon or germanium.

4. The method according to claim 1 wherein said surface of said substrate is cleaned before electrically neutral aluminum is deposited.

* * * * *